United States Patent
Connell et al.

(10) Patent No.: US 6,621,348 B2
(45) Date of Patent: Sep. 16, 2003

(54) VARIABLE GAIN AMPLIFIER WITH AUTOBIASING SUPPLY REGULATION

(75) Inventors: Lawrence E. Connell, Naperville, IL (US); Neal W. Hollenbeck, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/001,388

(22) Filed: Oct. 25, 2001

(65) Prior Publication Data

US 2003/0085764 A1 May 8, 2003

(51) Int. Cl.[7] .................................................. H03F 1/22
(52) U.S. Cl. ........................ 330/296; 330/285; 330/311
(58) Field of Search ............................... 330/285; 4/296, 4/311

(56) References Cited

U.S. PATENT DOCUMENTS

| | | | | |
|---|---|---|---|---|
| 6,046,640 A | * | 4/2000 | Brunner | 330/254 |
| 6,316,996 B1 | * | 11/2001 | Puotiniemi | 330/254 |
| 6,424,222 B1 | * | 7/2002 | Jeong et al. | 330/285 |

* cited by examiner

Primary Examiner—Robert Pascal
Assistant Examiner—Khanh Van Nguyen
(74) Attorney, Agent, or Firm—Karin L. Williams; Heather Mansfield

(57) ABSTRACT

A high gain wide-band width RF amplifier 120 with automatic bias supply regulation. The load supply is actively adjusted in response to the amplifier's output signal level. At small output signals effective load supply voltage is minimum and at larger output signals the effective load supply voltages is maximized. The amplifier 120 includes a differential pair of field effect transistors (FETs) 102, 104 connected at common source connection 106 and biased by current bias FET 108 which is connected between common source connection 106 and amplifier signal input RFIN. A bias voltage ($V_{B1}$) is applied to the gate of bias device 108 and an automatic gain control voltage ($V_{AGC}$) is applied to the gates of differential FET pair 102, 104. The automatic bias supply circuit 122 is an active load and includes resistors 124, 126, capacitor 128 and a differential amplifier 130. Capacitor 128 is connected between the negative input 132 and the output 134 of differential amplifier 130. A load reference voltage VO is provided to the positive input. Resistor 124 is connected between the output 134 of differential amplifier 130 and the high gain wide-band amplifier output 136 at the drain of FET 104. Resistor 126 is connected between the output 136 at the drain of FET 104 and the negative input 132 to differential amplifier 130 providing amplifier load signal feedback.

11 Claims, 1 Drawing Sheet

-PRIOR ART-

VARIABLE GAIN AMPLIFIER WITH AUTOBIASING SUPPLY REGULATION

BACKGROUND OF THE INVENTION

1. Field of the Invention

The present invention is related to wide band linear amplifiers and more particularly to resistively loaded wideband high frequency linear amplifiers.

2. Background Description

Wide band multi-channel communication systems require wide band amplifiers with a high degree of linearity to avoid second and third order affects arising from the large number of potential carrier interactions. So, second and third order effects must be minimized for maximum linearity in the amplifier. Typically, some form of automatic gain control is included which reduces gain to compensate for large input signals, trading uniform gain for extended signal linearity.

Unfortunately, since for a typical integrated circuit amplifier output current flow is unidirectional, i.e., from a supply to supply return or ground, these prior art amplifiers typically steer current to/away from resistive loads, significantly changing the DC operating point of the amplifier. These operating point shifts can result in poor amplifier linearity and limit the amplifier gain range. If too large of a current is steered toward the resistive load, the output voltage can decrease significantly and can cause the amplifier to saturate, resulting in poor linearity, as well as degraded amplifier signal response and bandwidth. If too small of a current is steered toward the output resistive load, the output voltage can increase significantly, resulting in catastrophic device failure.

Thus, there is a need for a stable load bias for wide band multichannel amplifiers to maintain the amplifier at an intended operating bias point.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

Figure 1:
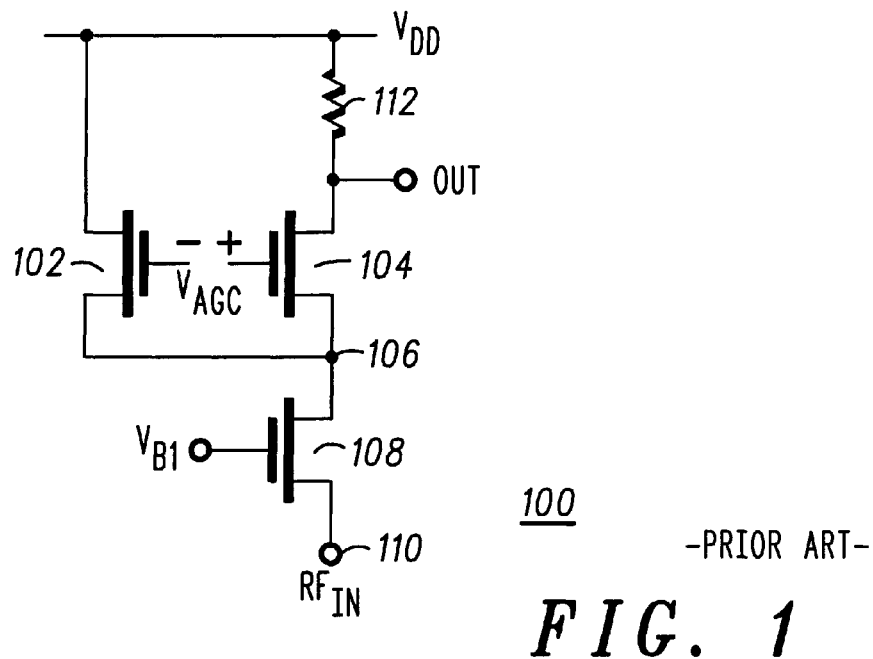
FIG. 1 shows a typical prior art wide-band amplifier passively loaded with a load resistor.

Turning now to the drawings and more particularly, FIG. 1 shows a typical such prior art wide-band amplifier 100 that is passively loaded with a load resistor ($R_L$) 112. Differential field effect transistor (FET) pair 102, 104 have a common source connection 106. FET 108 is tied source to drain, between input 110 and the common source connection 106. A differential gain control voltage ($V_{AGC}$) is applied between the gates of FETs 102, 104. A bias voltage $V_{B1}$ is applied to the gate of the FET 108. The drain of FET 102 is tied directly to a supply voltage ($V_{dd}$) and the drain of FET 104 is tied to the amplifier output (OUT). The load resistor $R_L$ 112 is tied between $V_{dd}$ and the amplifier output.

Amplifier linearity is a function of amplifier device bias conditions and, in particular, device drain to source voltage ($V_{ds}$) for each of the amplifier devices. Non-linearity can be introduced by parasitic device capacitances, intrinsic resistances and from overdriving the amplifier. Overdriving the amplifier results when the drain to source voltage of an amplifier device becomes too small such that the device comes out of saturation, degrading amplifier linearity and/or bandwidth.

Ideally, for the amplifier's entire range of operation, all three FETs 102, 104 and 108 are biased to operate in the saturation region. In saturation each device's drain to source voltage ($V_{ds}$) is greater than its gate to source voltage ($V_{gs}$) less the particular device's threshold voltage ($V_T$), i.e., $$V_{ds} > V_{gs} - V_T.$$

At steady state:

$$V_{out} = V_{dd} - I_{ds} * R_L$$

A FET in saturation acts as a voltage controlled current source, with device drain to source current ($I_{ds}$) essentially being directly proportional to $(V_{gs}-V_T)^2$ and independent of $V_{ds}$. For small signal applications, (i.e., applications where the signal ranges over a small portion of the signal response range) FET drain current variation ( ) $I_{ds}$) may be approximated by $$\Delta I_{ds} \cong \Gamma \Delta V_{gs}$$

So, the output signal, which is the variation in output voltage $V_{out}$, i.e., )$V_{out}$ is proportional to –ə)$V_{gs}$, where ə is device transconductance. $V_{gs}$ is a function of the gate bias voltage $V_{Bg}$, the source voltage of each FET and input signal $V_{RFIN}$. Any input signal driving the source of FET 108, effectively, is inverted at the gate of FET 108 and so, $$\Delta V_{gs} = -V_{RFIN}$$

and $$\Delta V_{out} \cong \Gamma_{RFIN} R_L$$

In part, however, $V_T$ is a function of source to substrate bias. $V_{gs}$ is a function of the gate bias voltage ($V_{B1}$ for FET 108 or gain control voltage $V_{AGC}$ for FETs 102, 104), and the source voltage of each particular FET. $V_{AGC}$ sets the gain bias point to FET pair 102, 104 which steers current either to the output load resistor 112 through FET 104 or through FET 102. Thus, for FET 108, $$\Delta I_{ds108} \cong -\Gamma_{108} V_{RFIN}$$

where ə$_{108}$ is the transconductance of FET 108 and for FET 104, $$\Delta I_{ds104} = -\frac{\Gamma_{104}}{\Gamma_{104} + \Gamma_{102}} [\Gamma_{108} V_{RFIN}]$$

where ə$_{102}$ and ə$_{104}$ are the transconductance of FETs 102 and 104, respectively, and furthermore are proportional to $V_{AGC}$. The amplifier output, $V_{out}$, is then equal to $$V_{out} = \frac{-\Gamma_{104}}{\Gamma_{104} + \Gamma_{102}} [\Gamma_{108} \cdot V_{RFIN}] \cdot R_L$$

While the above holds true for small signals, linearity concerns arise for larger signals, where the small signal approximation is not valid and $I_{ds}$ must be treated as proportional to $(V_{GS}-V_T)^2$. Thus, this above relationship holds true so long as the output remains in its linear operating range, i.e., $V_{AGC+}-V_T<V_{out}<V_{dd}$ and provided the average signal component is zero, i.e., provided $V_{RFIN}=0$.

Gain may be varied significantly by varying $V_{AGC}$ or bias voltage $V_{B1}$ (which varies $V_{ds108}$). Changing either of these reference voltages is reflected in the output operating point and can affect amplifier linearity. Increasing $V_{B1}$ or $V_{AGC}$ reduces $V_{ds}$ for one or all of FETs 102, 104 and 108 such that with sufficient input signal, the affected devices may come out of saturation increasing device capacitance and resulting in poor amplifier linearity. Also, the operating point shifts when the average signal component is not zero. Any non-zero average signal component is reflected as a DC operating point shift.

Thus as noted hereinabove, FET 104 will come out saturation if the operating point is such that the output signal falls below $V_{AGC+}-V_T$, regardless of whether from setting the original bias point such that the amplifier is overdriven or, from output signal induced bias point shifts. In addition, as previously described, the bias point may shift such that device 102 or 104 to turns off, where all or nearly all of the potential output voltage ($V_{dd}$) is felt across the off device. Thus, it is possible for the off device that $V_{ds}$ may exceed device breakdown voltage, destroying either or both of FETs 104 and 102.

In summary, as described hereinabove, the amplifier 100 is biased such that constant current flows through FET 108 and any signal variation at RFIN causes a linear variation in current flow through device 104. That linear variation in current flow through device 104 is reflected in the voltage drop across load resistor 112 and, as a result, in the output voltage which is $V_{dd}-I_{ds104} R_L$. $V_{AGC}$ is a differential signal applied such that when the gate of device 104 is increased, the gate of device 102 is decreased, resulting in constant current through device 108 and a constant voltage at 106. So, devices 104 and 102 steer current to either the output or the supply. Setting $V_{AGC}$ high, i.e., close to or approaching $V_{dd}$, reduces the output voltage swing of $V_{ds}$ for FET 104 and, thereby, reduces the linear range of the amplifier and, as a result, amplifier linearity. By contrast, reducing $V_{AGC}$ for small signal applications raises the amplifier operating point, biasing $V_{out}$ more towards $V_{dd}$ to increase the gate to drain potential for FETs 102 and 104. For large enough $V_{dd}$, the gate to drain potential may be large enough to cause either device to fail catastrophically.

Figure 2:
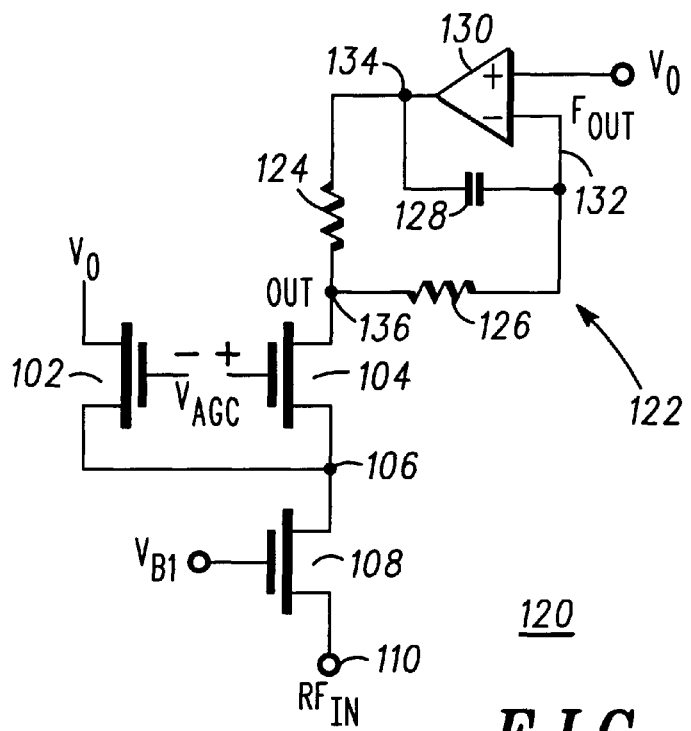
FIG. 2 shows a schematic of the preferred embodiment of a high gain wide-band width amplifier with automatic bias supply regulation.

FIG. 2 shows a schematic of the preferred embodiment of a high gain wide-band width amplifier 120 with automatic bias supply regulation. An active load 122 provides a load supply that is actively adjusted in response to DC bias shifts of the amplifier output. The amplifier 120 includes a differential pair of field effect transistors (FETs) 102, 104 connected at common source connection 106 and to the drain of amplifier FET 108. Amplifier FET 108 is connected between common source connection 106 and amplifier signal input RFIN. A bias voltage ($V_{B1}$) is applied to the gate of bias device 108 and an automatic gain control voltage ($V_{AGC}$) is applied differentially to the gates of differential FET pair 102, 104.

Active load 122 includes resistors 124, 126, capacitor 128 and a differential amplifier 130 to generate an automatic bias supply. Capacitor 128 is connected between the negative input 132 of differential amplifier 130 and the output 134 of differential amplifier 130. A load reference voltage VO is provided to the positive input. Resistor 124 is connected between the output 134 of differential amplifier 130 and the high gain wide-band amplifier output 136 at the drain of FET 104. Resistor 126 is connected between the output at the drain of FET 104 at output 136 and the negative input 132 to differential amplifier 130, providing amplifier load feedback.

Differential amplifier 130 provides load current to resistor 124 in response to bias shifts at output 136, maintaining the DC voltage at output 136 of differential amplifier 120 at a level equal to reference voltage VO, $V_{FOUT}$=VO. Resistor 126 and capacitor 128 form an integrating resistor compensating for radio frequency (RF) signals at FOUT ($V_{FOUT}$), and passing a compensated DC bias component to the output 136. At no input signal, $V_{out}$ 136 is VO, i.e., $V_{out}=V_{FOUT}=$ VO, and so, the output DC component is VO. When a signal is applied to input RFIN, the DC component might otherwise shift, e.g., due to signal duty cycle. Amplifier 130 compensates for any such shift increasing/decreasing drive to load resistor 124 to maintain the DC output component at VO. Thus, the active load 122 automatically adjusts the amplifier 120 bias point to compensate for any such signal induced shifts.

Advantageously, by including the high gain wide bandwidth amplifier 120 with automatic bias supply regulation of active load 122 on a radio frequency (RF) integrated circuit chip, the active load adjusts the amplifier output DC operating point by providing on-chip voltage regulation to the RF amplifier. The quiescent or DC voltage component of the amplifier output is maintained at VO, independent of the gain setting of the high gain wide-band amplifier 120. Thus, the operating range and gain for the amplifier may be increased while amplifier linearity is maintained over the entire output signal range.

Therefore, the high gain wide-band amplifier 120 of the present invention maximizes bandwidth and linearity over the expected operating range. Further, when used as a load for an RF amplifier on an integrated circuit chip, the active load 122 uses no appreciable additional chip area and so, adds no additional cost to the RF amplifier circuit. Thus, the wide band RF amplifier of the present invention is a low cost solution to the previously experienced problem of low gain at high frequency, i.e. at RF.

While the invention has been described in terms of preferred embodiments, those skilled in the art will recognize that the invention can be practiced with modification within the spirit and scope of the appended claims.

What is claimed:

1. A wide band high frequency amplifier comprising:
    a high gain amplifier receiving an input signal at an input and providing an output signal at an output; and
    an automatic bias supply connected to and loading said output, said automatic bias supply adjusting said output load in response to said output signal,
    wherein said automatic bias supply comprises:
        a differential amplifier biased at a positive input by a reference voltage;
        a load resistor connected between said output and an output of said differential amplifier; and
        an integrating resistor connected between said output and a negative input of said differential amplifier.

2. A wide band high frequency amplifier as in claim 1 wherein said integrating resistor comprises a resistor in series with a capacitor connected between said output and said negative input of said differential amplifier being connected between said resistor and said capacitor.

3. A wide band high frequency amplifier as in claim 2 wherein said high gain amplifier comprises:
    a differential pair of transistors, a first conduction terminal of each of said pair of differential transistors being connected to a common connection point, a second conduction terminal of a first of said differential pair of transistors being connected to a supply voltage and a second conduction terminal of an other of said differential pair of transistors being said output;

an input transistor connected between said common connection point and said input, a first conduction terminal of said third transistor being connected to said input and a second conduction terminal being connected to said common connection point;

a first bias voltage connected to a control terminal of said input transistor; and a second bias voltage differentially connected between a pair of control terminals, each on one of said differential pair of transistors.

4. A wide band high frequency amplifier as in claim 3 wherein each said transistor is a field effect transistor (FET).

5. A wide band high frequency amplifier as in claim 4 wherein each said FET is an n-type FET (NFET).

6. A wide band high frequency amplifier as in claim 5 wherein said wide band high frequency amplifier is a radio frequency (RF) amplifier.

7. An integrated circuit chip including a wide band high frequency linear amplifier, said wide band high frequency linear amplifier comprising:

a noninverting high gain amplifier receiving an input signal at an input and providing an output signal at an output; and an automatic bias supply connected to and loading said output, said automatic bias supply adjusting said output load in response to said output signal, wherein said automatic bias supply comprises:

a differential amplifier biased at a positive input by a reference voltage;

a load resistor connected between said output and an output of said differential amplifier; and a low pass filter connected between said output and a negative input of said differential amplifier.

8. An integrated circuit chip as in claim 7 wherein said low pass filter is a resistor connected between said output and said negative input of said differential amplifier and a capacitor connected between said negative input and ground.

9. An integrated circuit chip as in claim 8 wherein said noninverting high gain amplifier comprises:

a differential pair of field effect transistors (FETs) having a common source connection, a drain of a first of said differential pair of FETs being connected to a supply voltage and a drain of an other of said differential pair of FETs being said output;

an input FET connected drain to source between said common source connection of said differential pair of FETs and said input;

a bias voltage connected to a gate of said input FET; and an automatic gain control voltage differentially connected to a gate each of said differential pair of FETs.

10. An integrated circuit as in claim 9 wherein each of said FETs is an n-type FET (NFET).

11. An integrated circuit as in claim 10 wherein a plurality of circuits on said integrated circuit chip are operating at radio frequency and said wide band high frequency amplifier is a radio frequency amplifier.

\* \* \* \* \*